United States Patent
Cho

(10) Patent No.: US 9,879,143 B2
(45) Date of Patent: Jan. 30, 2018

(54) PRECURSOR SOLUTION FOR FORMING METAL CHALCOGENIDE FILM

(71) Applicant: SAMSUNG ELECTRONICS CO., LTD., Suwon-si (KR)

(72) Inventor: Kyungsang Cho, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 259 days.

(21) Appl. No.: 14/706,315

(22) Filed: May 7, 2015

(65) Prior Publication Data

US 2015/0325438 A1 Nov. 12, 2015

(30) Foreign Application Priority Data

May 9, 2014 (KR) .................. 10-2014-0055754

(51) Int. Cl.
| | |
|---|---|
| *H01B 1/06* | (2006.01) |
| *B05D 5/12* | (2006.01) |
| *C09D 5/24* | (2006.01) |
| *H01L 21/02* | (2006.01) |
| *H01L 21/477* | (2006.01) |

(Continued)

(52) U.S. Cl.
CPC .................. *C09D 5/24* (2013.01); *B05D 5/12* (2013.01); *H01B 1/06* (2013.01); *H01L 21/0256* (2013.01); *H01L 21/02422* (2013.01); *H01L 21/02557* (2013.01); *H01L 21/02562* (2013.01); *H01L 21/02568* (2013.01); *H01L 21/02628* (2013.01); *H01L 21/02664* (2013.01); *H01L 21/477* (2013.01); *H01L 31/18* (2013.01); *H01L 31/1828* (2013.01); *H01L 31/1864* (2013.01); *H01L 33/005* (2013.01); *H01L 33/0083* (2013.01); *H01L 33/0095* (2013.01); *Y02E 10/543* (2013.01)

(58) Field of Classification Search
CPC ... H01B 1/00; H01B 1/06; H01B 1/10; C09D 5/24; B05D 5/12
See application file for complete search history.

(56) References Cited

U.S. PATENT DOCUMENTS

| | | | |
|---|---|---|---|
| 7,341,917 B2 | 3/2008 | Milliron et al. | |
| 7,494,841 B2 * | 2/2009 | Mitzi | ...................... C01B 21/16 257/42 |

(Continued)

FOREIGN PATENT DOCUMENTS

| | | |
|---|---|---|
| KR | 10-1179010 B1 | 8/2012 |
| RU | 2366541 C2 * | 9/2009 |

OTHER PUBLICATIONS

Zhang et al "Synthesis and thermoelectric property of Cu2-xSe nanowire", J. Phys. Chem. C 2010, 114, 14849-14853.*

(Continued)

*Primary Examiner* — Mark Kopec
(74) *Attorney, Agent, or Firm* — Sughrue Mion, PLLC

(57) ABSTRACT

A chalcogen element can be effectively dissolved in a non-explosive hydrazine-based solvent by the aid of sodium in a non-explosive hydrazine-based solvent. Therefore, a precursor solution for forming a metal chalcogenide film containing as a solvent a non-explosive hydrazine-based solvent which is less poisonous than hydrazine and which is free of explosiveness is provided. A metal chacogenide thin film may be formed employing the metal chalcogenide precursor solution.

16 Claims, 6 Drawing Sheets

(51) Int. Cl.
*H01L 31/18* (2006.01)
*H01L 33/00* (2010.01)

(56) References Cited

U.S. PATENT DOCUMENTS

| | | |
|---|---|---|
| 2010/0041907 A1 | 2/2010 | Mitzi et al. |
| 2014/0072500 A1* | 3/2014 | Kuwahara ............. C01B 21/092 |
| | | 423/413 |
| 2016/0111283 A1* | 4/2016 | Esmaeil Zaghi . H01L 21/02568 |
| | | 438/502 |

OTHER PUBLICATIONS

Jiang et al "Room-temperature synthesis of copper and silver, nanocrystalline chalcogenides in mixed solvents", Journal Solid State Chemistry 167, 28-33 (2002).*

Buyong Wan, et al.; "Optical Properties of ZnTe Nanorods Synthesized Via a Facile Low-Temperature Solvothermal Route"; Elsevier; Materials Science and Engineering B; vol. 171; 2010; pp. 11-15.

Jin Du, et al.; "Solvothermal Synthesis of Single Crystalline ZnTe Nanorod Bundles in a Mixed Solvent of Ethylenediamine and Hydrazine Hydrate"; Elsevier; Journal of Crystal Growth; vol. 29; 2006; pp. 183-186.

* cited by examiner

PRECURSOR SOLUTION FOR FORMING METAL CHALCOGENIDE FILM

RELATED APPLICATION

This application claims the benefit of Korean Patent Application No. 10-2014-0055754, filed on May 9, 2014, in the Korean Intellectual Property Office, the disclosure of which is incorporated herein in its entirety by reference.

BACKGROUND

1. Field

The present disclosure relates to film deposition techniques, and more particularly, to metal chalcogenide film deposition techniques. For instance, metal chalcogenide film deposition techniques may be applied to the fabrication of semiconductor devices, solar cells, light-emitting diodes, etc.

2. Description of the Related Art

In the formation of semiconductor films, a vapor deposition process such as chemical vapor deposition, physical vapor deposition, or sputtering is generally used. If a vapor deposition process can be replaced with a liquid deposition process, the coasts associated with equipment, facilities, processes, and energy may be significantly reduced because the liquid deposition process may be performed by an inexpensive coating method such as a spin coating method.

Liquid deposition processes may require a precursor in a liquid form. However, inorganic substances such as metal chalcogenide compounds are not dissolved well in most solvents.

An approach of preparing a precursor solution using organometallic compounds which are soluble in solvents may be considered. However, if a precursor solution including organometallic compounds is employed to form an inorganic films, it is necessary to remove organic moieties from precursor films formed from the organometallic compounds. Organic moieties may be decomposed or evaporated by heating the precursor films at temperatures of about 500° C. or higher. However, such an organic moiety removal process results in the formation of porous inorganic films instead of dense inorganic films. Moreover, the organic moiety removal process leaves carbon residue on the inorganic films. The carbon residue may adversely affect electrical properties of the inorganic films.

Thus, a precursor solution containing inorganic compounds which is free of problems associated with the use of organometallic compounds are still desired.

It has recently been suggested to use hydrazine, to which $Te^{2+}$ ions are added, as a solution for preparing a precursor solution containing ZnTe as a metal chalcogenide compound. Solution Processing of Chalcogenide Semiconductors Via Dimensional Reduction, David B. Mitzi, Adv. Mater. 2009, 21, 3141-3158.

$Te^{2+}$ ion-containing hydrazine may be prepared by injecting metal tellurium (Te) into hydrazine. The metal Te is converted into $Te^{2+}$ ions in hydrazine to form a "$Te^{2+}$-hydrazine solvent system." Hydrazine alone may not dissolve ZnTe bulk powder. However, the "$Te^{2+}$-hydrazine solvent system" may effectively dissolve ZnTe bulk particles through a dimension reduction mechanism. The ZnTe bulk particles may be illustrated as a three-dimensional copolymer. $Te^{2+}$ ions in hydrazine attack and break a bond between zinc (Zn) and Te. Accordingly, the ZnTe bulk particles are divided and converted into a solute having a size of monomer (Zn—Te) or cluster including two to several hundreds of "—Zn—Te—" units.

However, hydrazine is poisonous and may be explosive. Using hydrazine in the ambient atmosphere raises many technical issues. Therefore, there are many limits to using precursor solutions including hydrazine as a solvent in industrial applications. Unlike hydrazine, hydrazine derivatives, hydrazine hydrates, or hydrazine derivative hydrates are not explosive at ambient atmosphere.

In order to dissolve metal chalcogenide compounds through dimension reduction mechanisms, ions of a chalcogen element are included in the solvent system. However, the ionization of the chalcogen element does not occur in non-explosive hydrazine-based solvents such as hydrazine hydrates, hydrazine derivatives, hydrazine derivative hydrates, etc. Accordingly, metal chalcogenide compound solutions containing the non-explosive hydrazine-based solvents as solvents do not exist.

SUMMARY

As described in the present disclosure, it has been found that if sodium is added to non-explosive hydrazine-based solvents, chalcogen elements are dissolvable in the non-explosive hydrazine-based solvents. Accordingly, according to the present disclosure, even though non-explosive hydrazine-based solvents are used, it is possible to dissolve metal chalcogenide compounds via dimension reduction mechanisms.

Provided are precursor solutions for forming metal chalcogenide films containing non-explosive hydrazine-based solvents which are less poisonous than hydrazine and are free of explosiveness.

Provided are methods of preparing precursor solutions for forming metal chalcogenide films containing non-explosive hydrazine-based solvents.

Provided are methods of manufacturing metal chalcogenide films using a precursor solution for forming a metal chalcogenide film containing a non-explosive hydrazine-based solvent.

Additional aspects will be set forth in part in the description which follows and, in part, will be apparent from the description, or may be learned by practice of the presented embodiments.

According to an aspect of the present disclosure, a precursor solution for forming a metal chalcogenide film includes a non-explosive hydrazine-based solvent, and a metal chalcogenide compound dissolved in the non-explosive hydrazine-based solvent.

According to another aspect of the present disclosure, a method of preparing a precursor solution for forming a metal chalcogenide film includes dissolving a metal chalcogenide compound in a solvent system containing chalcogen element cations, sodium cations, and a non-explosive hydrazine-based solvent.

According to another aspect of the present disclosure, a method of manufacturing a metal chalcogenide film includes: coating a substrate with a precursor solution including a non-explosive hydrazine-based solvent and a metal chalcogenide compound dissolved in the non-explosive hydrazine-based solvent, so as to form a precursor solution layer on the substrate; removing the non-explosive hydrazine-based solvent from the precursor solution layer to form a precursor film layer; and annealing the precursor film layer to form a metal chalcogenide film.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
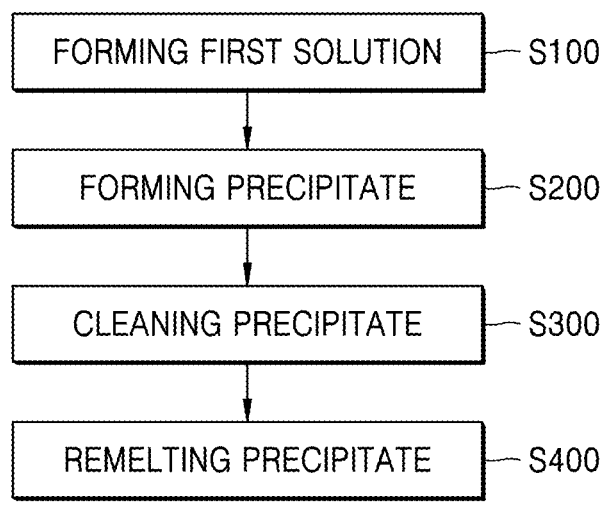
FIG. 1 is a flowchart of an embodiment of a preparation method of a precursor solution for forming a metal chalcogenide film.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, a precursor solution for forming a metal chalcogenide film according to an aspect of the present disclosure is described more in detail. An embodiment of a precursor solution for forming a metal chalcogenide film includes: a non-explosive hydrazine-based solvent; and a metal chalcogenide compound dissolved in the non-explosive hydrazine-based solvent.

The non-explosive hydrazine-based solvent functions as a solvent in which a dissolved state of the metal chalcogenide compound is maintained. The non-explosive hydrazine-based solvent has a substantially low toxicity compared to hydrazine. Further, the non-explosive hydrazine-based solvent is free of explosiveness in the air. Accordingly, the precursor solution for forming a metal chalcogenide film of the present disclosure based on the non-explosive hydrazine-based solvent may be applied to the metal chalcogenide film-forming process very safely and cost-effectively. Further, since the precursor solution for forming the metal chalcogenide film of the present disclosure is free of explosiveness in the ambient atmosphere, it is possible to anneal a precursor film formed from the precursor solution for forming the metal chalcogenide film of the present disclosure. Accordingly, the precursor solution for forming the metal chalcogenide film of the present disclosure may also be applied to manufacturing inorganic oxide films.

Examples of the non-explosive hydrazine-based solvent that is free of explosiveness in the air are not limited and may be selected from the group consisting of hydrazine hydrates, hydrazine derivatives, hydrazine derivative hydrates, and combinations thereof.

The hydrazine hydrates are not limited and may be represented by the Formula $N_2H_4 \cdot nH_2O$, wherein n is from 1 to 9.

Examples of the hydrazine derivatives are not limited and may be selected from the group consisting of methyl hydrazine, dimethyl hydrazine, ethylenediamine, 1,3-diaminopropane, phenylenediamine, ethylamine, propylamine, diethylamine, and combinations thereof.

Examples of the hydrazine derivative hydrates are not limited and may be selected from the group consisting of: hydrates of methyl hydrazine, dimethyl hydrazine, ethylenediamine, 1,3-diaminopropane, phenylenediamine, ethylamine, propylamine and diethylamine; and combinations thereof.

The metal chalcogenide compound exists in the form of a solute in the non-explosive hydrazine-based solvent. Namely, the metal chalcogenide compound exists in the form of monomers or clusters. A monomer means a basic unit of the metal chalcogenide compound. For instance, in the case of ZnTe, a ZnTe monomer, i.e., Zn—Te, has a Zn element and a Te element that are bonded to each other. The cluster is a small three-dimensional polymer having two to several hundreds of monomers that are coupled to each other. For instance, the cluster may have 2 to 999 monomers that are coupled to each other. In another instance, the cluster may have 2 to 9 monomers that are bonded to each other.

The fact that such a metal chalcogenide cluster exists in the form of a dissolved solute in the solution may be identified from that (i) the metal chalcogenide cluster does not form a precipitate in the solution and (ii) no background scattering is detected when measuring UV/Vis absorption spectra.

The metal chalcogenide compound means a compound formed by coupling a chalcogen element with a metal element. Examples of the chalcogen element may include at least one element selected from the group consisting of sulfur (S), selenium (Se), and tellurium (Te). Examples of the metal element are not limited and may include tin (Sn), antimony (Sb), mercury (Hg), indium (In), germanium (Ge), gallium (Ga), bismuth (Bi), copper (Cu), zinc (Zn), iron (Fe), manganese (Mn), nickel (Ni), titanium (Ti), molybdenum (Mo), and cobalt (Co). Specific examples of the metal chalcogenide compound may include $Zn_2S_2$, $Zn_2Se_2$, $Zn_2Te_2$, ZnS, ZnSe, ZnTe, $ZnS_4$, $ZnSe_4$, $ZnTe_4$, $Cu_2S_2$, $Cu_2Se_2$, $Cu_2Te_2$, $Cu_2S$, $Cu_2Se$, $Cu_2Te$, $Mn_2S_2$, $Mn_2Se_2$, $Mn_2Te_2$, $Fe_2S_2$, $Fe_2Se_2$, $Fe_2Te_2$, $Co_2S_2$, $Co_2Se_2$, $Co_2Te_2$, $Sn_2S_6$, $SnS_4$, $Sn_2Se_6$, $SnSe_4$, $Sn_2Te_6$, $SnTe_4$, $In_2S_4$, $In_2Se_4$, $In_2Te_3$, $Ga_2S_3$, $Ga_2Se_3$, $Ga_2Te_3$, $CuInSe_2$, $Cu_7S_4$, $Hg_3Se_4$, $Ge_2S$, $Ge_2S_6$, $Ge_2Se$, $Ge_2Se_6$, $Ge_2Te$, $Ge_2Te_6$, $Sb_2S_3$, $Sb_2Se_3$, $Sb_2Te_3$, $SbS_4$, $SbSe_4$, $SbTe_4$, and combinations thereof.

For instance, the precursor solution for forming the metal chalcogenide film may include the non-explosive hydrazine-based solvent in the amount from about 500 parts by weight to about $1 \times 10^8$ parts by weight based on 100 parts by weight of the metal chalcogenide compound.

In another embodiment, the precursor solution for forming the metal chalcogenide film may additionally include chalcogen ions and sodium ions. The sodium ions existing in hydrazine hydrates may accelerate ionization of a chalcogen element into chalcogen ions in the hydrazine hydrates. Further, the chalcogen element or ions may be coupled to sodium ions in the hydrazine hydrates to form an ion complex. Further, sodium ions and chalcogen ions, or the ion complex that is formed by coupling a chalcogen element or ions to sodium ions may accelerate the dissolution of the metal chalcogenide compound through a dimension reduction mechanism. Accordingly, if the precursor solution for forming the metal chalcogenide film additionally includes chalcogen ions and sodium ions, a phenomenon in which the metal chalcogenide compound is coagulated and settled may be prevented more effectively or for an extended time.

In order to effectively generate a dimension reduction of the metal chalcogenide compound in the solvent, the chalcogen element contained in the metal chalcogenide compound may be equal to the chalcogen element that forms the chalcogen ions. For instance, A ZnTe solution may additionally include Te ions like $Te^{2+}$ and $Na^+$. For other instance, a ZnSe solution may additionally include Se ions like $Se^{2+}$ and $Na^+$. In another instance, a ZnS solution may additionally include S ions like $S^{2+}$ and $Na^+$.

For instance, the precursor solution for forming the metal chalcogenide film may include the chalcogen ions in the amount from about 1 part by weight to about 10,000 parts by weight based on 100 parts by weight of the metal chalcogenide compound. The content of the chalcogen ions is substantially equal to the amount of the chalcogen element injected into the solution. If the amount of the chalcogen ions contained in the precursor solution for forming the metal chalcogenide film is less than about 1 part by weight based on 100 parts by weight of the metal chalcogenide compound, the effects of the dimension reduction may rarely be obtained. If the amount of the chalcogen ions contained in the precursor solution for forming the metal chalcogenide film is far too large, the chalcogen ions may not be dissolved in the solution to a sufficient amount due to solubility limitations.

For instance, the precursor solution for forming the metal chalcogenide film may include the sodium ions in the amount from about 1 part by weight to about 10,000 parts by weight based on 100 parts by weight of the metal chalcogenide compound. The content of the sodium ions is substantially equal to the amount of the sodium element injected into the solution. If the amount of the sodium ions contained in the precursor solution for forming the metal chalcogenide film is less than about 1 part by weight based on 100 parts by weight of the metal chalcogenide compound, the effects of adding the sodium ions may be insignificant. If the amount of the sodium ions contained in the precursor solution for forming the metal chalcogenide film is too large, sodium may not be dissolved in the solution to a sufficient amount due to solubility limitations.

Hereinafter, referring to FIG. 1, a preparation method of a precursor solution for forming a metal chalcogenide film according to another aspect of the present disclosure, is described more in detail. FIG. 1 is a flowchart of an embodiment of a preparation method of a precursor solution for forming a metal chalcogenide film. The preparation method of a precursor solution for forming a metal chalcogenide film of FIG. 1 includes dissolving a metal chalcogenide compound in a solvent system containing chalcogen element cations, sodium cations, and a non-explosive hydrazine-based solvent to form a metal chalcogenide compound first solution (S100).

The solvent system contains chalcogen element cations, sodium cations, and a non-explosive hydrazine-based solvent. Sodium ions existing in the non-explosive hydrazine-based solvent may accelerate that a chalcogen element is ionized into the chalcogen ions in the non-explosive hydrazine-based solvent. Further, the chalcogen element or ions may be coupled to sodium ions in the non-explosive hydrazine-based solvent to form an ion complex. Further, sodium ions and chalcogen ions, or the ion complex that is formed by coupling chalcogen element or ions to sodium ions may accelerate the dissolution of the metal chalcogenide compound through a dimension reduction mechanism.

For instance, the solvent system may include the non-explosive hydrazine-based solvent in the amount from about 500 parts by weight to about $1 \times 10^8$ parts by weight based on 100 parts by weight of the metal chalcogenide compound to be dissolved. In an embodiment, the amount of the non-explosive hydrazine-based solvent may range from about $10^4$ parts by weight to about $10^6$ parts by weight based on 100 parts by weight of the metal chalcogenide compound.

For instance, the solvent system may include the chalcogen ions in the amount from about 1 part by weight to about 10,000 parts by weight based on 100 parts by weight of the metal chalcogenide compound to be dissolved. In an embodiment, the amount of the chalcogen ion may range from about 1 part by weight to about 50 parts by weight based on 100 parts by weight of the metal chalcogenide compound. The content of the chalcogen ions is substantially equal to the amount of the chalcogen element in a chalcogen supply source injected into the solvent system. For instance, the chalcogen supply source may be the chalcogen element. The chalcogen element in the chalcogen supply source and the chalcogen element in the metal chalcogenide compound to be dissolved may be the same to each other.

For instance, the solvent system may include the sodium ions in the amount from about 1 part by weight to about 10,000 parts by weight based on 100 parts by weight of the metal chalcogenide compound to be dissolved. In an embodiment, the amount of the sodium ion may range from about 1 part by weight to about 20 parts by weight based on 100 parts by weight of the metal chalcogenide compound. The content of the sodium ions is substantially equal to the amount of the sodium element in a sodium supply source injected into the solvent system. For instance, the sodium supply source may be sodium metal, NaOH, NaCl, $Na_2S$, $Na_2Se$, $Na_2Te$, NaI, or combinations thereof.

For instance, the solvent system may have a temperature from about 20° C. to about 200° C. If the temperature is too low, a dimension reduction reaction of the chalcogenide compound may slow down, or the solubility of the chalcogenide compound may drop. If the temperature is too high, the stability of the solvent system may deteriorate. In an embodiment, the temperature may range from about 30° C. to about 80° C.

The dissolution process may be performed by stirring the metal chalcogenide compound and the solvent system after injecting the metal chalcogenide compound into a solvent system containing chalcogen element cations, sodium cations, and a non-explosive hydrazine-based solvent. Further, the dissolution process may be performed by stirring the non-explosive hydrazine-based solvent, the chalcogen supply source, the sodium supply source, and the metal chalcogenide compound after injecting a chalcogen supply source, a sodium supply source, and a metal chalcogenide compound into the non-explosive hydrazine-based solvent. As a result of that, a metal chalcogenide compound first solution additionally including chalcogen ions and sodium ions may be obtained. Such obtained metal chalcogenide compound first solution may be intactly used as a precursor solution for forming a metal chalcogenide film.

The embodiment of FIG. 1 may additionally include:

injecting a cleaning solvent into a metal chalcogenide compound first solution to obtain a metal chalcogenide compound precipitate (S200);

optionally cleaning the precipitate with a cleaning solvent (S300); and dissolving the precipitate obtained in operation S200 or the precipitate cleaned in operation S300 in a non-explosive hydrazine-based solvent to obtain a metal chalcogenide compound second solution (S400).

If the cleaning solvent is injected into the metal chalcogenide compound first solution in operation S200, the metal chalcogenide compound precipitate is produced. It is noteworthy that such produced precipitate is not bulk particles of the metal chalcogenide compound, but an aggregate of metal chalcogenide compound monomers or clusters. Such an aggregate may be remelted in the non-explosive hydrazine-based solvent very easily even without passing through a dimension reduction mechanism.

Examples of the cleaning solvent are not limited and may be selected from the group consisting of methanol, ethanol, propanol, butanol, and combinations thereof.

For instance, the precipitate may be separated from a mixture of the metal chalcogenide compound first solution and an alcohol-based solvent by centrifugation. Understandably, the solvent system containing chalcogen ions and sodium ions is removed in this process. Accordingly, the precipitate may have very low residual amounts of the chalcogen ions and sodium ions.

If it is necessary to further lower the residual amounts of the chalcogen ions and sodium ions existing in the precipitate, operation S300 may be optionally conducted. Examples of the cleaning solvent are not limited and may include methanol, ethanol, propanol, butanol, and combinations thereof. For instance, the cleaned precipitate may be separated from a mixture of the precipitate and cleaning solvent by centrifugation. Operation S300 may be repeated more than two times. As the number of repetitions of operation S300 increases, the residual amounts of the chalcogen ions and sodium ions existing in the precipitate further decrease.

In operation S400, the precipitate obtained in operation S200 or the precipitate cleaned in operation S300 is dissolved in the non-explosive hydrazine-based solvent to obtain a metal chalcogenide compound second solution. The precipitate obtained in operation S200 or the precipitate cleaned in operation S300 is not bulk particles of the metal chalcogenide compound, but an aggregate of metal chalcogenide compound monomers or clusters. Therefore, the precipitate obtained in operation S200 or the precipitate cleaned in operation S300 may be remelted in the non-explosive hydrazine-based solvent very easily even without passing through a dimension reduction mechanism. Such obtained metal chalcogenide compound second solution may be used as a precursor solution for forming a metal chalcogenide film.

Hereinafter, a method of manufacturing a metal chalcogenide film according to another aspect of the present disclosure is described more in detail. The method of manufacturing a metal chalcogenide film includes:

coating a precursor solution including a non-explosive hydrazine-based solvent and a metal chalcogenide compound dissolved in the non-explosive hydrazine-based solvent on a substrate to form a precursor solution layer;

removing the non-explosive hydrazine-based solvent from the precursor solution layer to form a precursor film layer; and annealing the precursor film layer to form a metal chalcogenide film.

The precursor solution layer is formed by coating the precursor solution including the non-explosive hydrazine-based solvent and the metal chalcogenide compound dissolved in the non-explosive hydrazine-based solvent on the substrate. The substrate may include any solid materials. Examples of the substrate are not limited and may include glass, quartz, sapphire, silicon, semiconductors, metals, and oxides typically such as Indium Tin Oxide (ITO). The substrate may be of any shapes. Examples of substrate shapes are not limited and may include a two-dimensional plane, a curved surface, a rod, and a sphere. For instance, coating of the precursor solution may be performed by solution processes such as dipping, spraying, spin coating, painting, drop casting, casting, and inkjet printing. Further, the precursor solution may also be used as a thin film precursor in deposition processes such as thermal deposition, physical vapor deposition (PVD), and chemical vapor deposition (CVD).

The precursor film layer is formed by removing the non-explosive hydrazine-based solvent from the precursor solution layer. For instance, the process of removing the non-explosive hydrazine-based solvent may be carried out by heating the precursor solution layer to a temperature from about 70° C. to about 200° C. The non-explosive hydrazine-based solvent may not be removed well if the temperature is lower than 70° C., and conversion of the thin film may occur along with removal of the non-explosive hydrazine-based solvent if the temperature is higher than 200° C. Since such formed precursor film layer is composed of an aggregate of monomers or clusters of the metal chalcogenide compound, it may be difficult to exhibit the performance that is expected from the metal chalcogenide film.

The metal chalcogenide film may be obtained by annealing the precursor film layer. Aggregates of monomers or clusters of the metal chalcogenide compound in the precursor film layer are coupled to each other by annealing the precursor film layer. Accordingly, the precursor film layer is converted into a metal chalcogenide film. For instance, the process of annealing the precursor film layer may be performed by heating the precursor film layer to a temperature of about 70° C. or higher. If the temperature is lower than 70° C., the conversion from the precursor solution to a thin film may not occur well. The process of annealing the precursor film layer may be performed in a reductive atmosphere, an inert atmosphere, or an oxidative atmosphere. If the process of annealing the precursor film layer is performed in the oxidative atmosphere, a metal oxide film may be formed.

For instance, a method of manufacturing a metal chalcogenide film of the present disclosure may be applied to unlimited manufacturing processes of semiconductor devices, solar cells, and light-emitting diodes including the metal chalcogenide film.

EXAMPLES

Example 1—Manufacturing of ZnTe Film

After injecting 40 mg of NaOH and 127 mg of Te into 10 g of hydrazine monohydrate, a solvent system was prepared by dissolving Te while stirring NaOH, Te and hydrazine monohydrate at a temperature of 60° C. within a glove box.

After injecting 190 mg of ZnTe powder into thus-obtained solvent system, a ZnTe first solution was prepared by dissolving the ZnTe powder while stirring the ZnTe powder at a temperature of 60° C. within the glove box.

After injecting 40 ml of anhydrous methanol into thus-obtained ZnTe first solution, ultrasonic vibration was applied to the resulting mixture of anhydrous methanol and the ZnTe first solution for one hour. After allowing the mixture of the anhydrous methanol and ZnTe first solution to stand for about 24 hours, the mixture was centrifuged to obtain a ZnTe precipitate. The obtained ZnTe precipitate was washed with methanol three times to obtain a cleaned ZnTe precipitate.

100 mg of the cleaned ZnTe precipitate was remelted in 10 g of hydrazine monohydrate to obtain a ZnTe second solution.

The ZnTe second solution was spin-coated on a glass substrate to form a ZnTe solution layer on the glass substrate.

The ZnTe solution layer was heated at 100° C. in a nitrogen atmosphere for 15 minutes, and hydrazine monohydrate was removed to form a ZnTe precursor film layer.

The ZnTe precursor film layer on the substrate was heated and annealed at 200° C. in a nitrogen atmosphere for 30 minutes to complete a ZnTe film.

Example 2—Manufacturing of ZnSe Film

After injecting 40 mg of NaOH and 80 mg of Se into 10 g of hydrazine monohydrate, a solvent system was prepared by dissolving Se while stirring NaOH, Se, and hydrazine monohydrate at a temperature of 60° C. within a glove box.

After injecting 144 mg of ZnSe powder into thus-obtained solvent system, a ZnSe first solution was prepared by dissolving the ZnSe powder while stirring the ZnSe powder at a temperature of 60° C. within the glove box.

After injecting 40 ml of anhydrous methanol into thus-obtained ZnSe first solution, ultrasonic vibration was applied to the resulting mixture of anhydrous methanol and the ZnSe first solution for one hour. After allowing the mixture of to stand for about 24 hours, the mixture was centrifuged to obtain a ZnSe precipitate. The obtained ZnSe precipitate was cleaned with methanol three times to obtain a cleaned ZnSe precipitate.

100 mg of the cleaned ZnSe precipitate was remelted in 10 g of hydrazine monohydrate to obtain a ZnSe second solution.

The ZnSe second solution was spin-coated on a substrate (Si-wafer) to form a ZnSe solution layer on the substrate.

The ZnSe solution layer was heated at 70° C. in a nitrogen atmosphere for 30 minutes, and hydrazine monohydrate was removed to form a ZnSe precursor film layer.

The ZnSe precursor film layer on the substrate was heated and annealed at 150° C. in a nitrogen atmosphere for 120 minutes to complete a ZnSe film.

Example 3—Manufacturing of ZnS Film

After injecting 40 mg of NaOH and 30 mg of S into 10 g of hydrazine monohydrate, a solvent system was prepared by dissolving S while stirring NaOH, S and hydrazine monohydrate at a temperature of 60° C. within a glove box.

After injecting 100 mg of ZnS powder into thus-obtained solvent system, a ZnS first solution was prepared by dissolving the ZnS powder while stirring the ZnS powder at a temperature of 60° C. within the glove box.

After injecting 40 ml of anhydrous methanol into thus-obtained ZnS first solution, ultrasonic vibration was applied to the resulting mixture of anhydrous methanol and the ZnS first solution for one hour. After allowing the mixture to stand for about 24 hours, a mixture of the ZnS first solution and anhydrous methanol was centrifuged to obtain a ZnS precipitate. The obtained ZnS precipitate was cleaned with methanol three times to obtain a cleaned ZnS precipitate.

100 mg of the cleaned ZnS precipitate was remelted in 10 g of hydrazine monohydrate to obtain a ZnS second solution.

The ZnS second solution was spin-coated on an Indium Tin Oxide (ITO) glass substrate to form a ZnS solution layer on the substrate.

The ZnS solution layer was heated at 60° C. in a nitrogen atmosphere for 30 minutes, and hydrazine monohydrate was removed to form a ZnS precursor film layer.

The ZnS precursor film layer on the substrate was heated and annealed at 180° C. for 90 minutes to complete a ZnS film.

Comparative Example 1—Manufacturing of ZnTe Film without Using Sodium

After injecting 127 mg of Te into 10 g of hydrazine monohydrate, a solvent system was prepared by dissolving Te while stirring Te and hydrazine monohydrate at a temperature of 60° C. within a glove box.

After injecting 190 mg of ZnTe powder into thus-obtained solvent system, a ZnTe first solution was prepared by dissolving the ZnTe powder while stirring the ZnTe powder at a temperature of 60° C. within the glove box.

The ZnTe first solution was centrifuged at about 6,000 rpm for about 20 minutes to remove the precipitate.

After injecting 40 ml of anhydrous methanol into thus-obtained ZnTe first solution, ultrasonic vibration was applied to the mixture of anhydrous methanol and the ZnTe first solution for one hour. After allowing the mixture to stand for about 24 hours, a mixture of the ZnTe first solution and anhydrous methanol was centrifuged to obtain a ZnTe precipitate. The obtained ZnTe precipitate was cleaned with methanol three times to obtain a cleaned ZnTe precipitate.

0.2 mg of the cleaned ZnTe precipitate was remelted in 10 g of hydrazine monohydrate to obtain a ZnTe second solution.

The ZnTe second solution was spin-coated on a glass substrate to form a ZnTe solution layer on the substrate.

The ZnTe solution layer was heated at 100° C. in a nitrogen atmosphere for 10 minutes, and hydrazine monohydrate was removed to form a ZnTe precursor film layer.

The ZnTe precursor film layer on the substrate was heated and annealed at 200° C. in a nitrogen atmosphere for 60 minutes to complete a ZnTe film.

Comparative Example 2—Manufacturing of ZnSe Film Without Using Sodium

After injecting 80 mg of Se into 10 g of hydrazine monohydrate, a solvent system was prepared by dissolving Se while stirring Se and hydrazine monohydrate at a temperature of 60° C. within a glove box.

After injecting 144 mg of ZnSe powder into thus-obtained solvent system, a ZnSe first solution was prepared by dissolving the ZnSe powder while stirring the ZnSe powder at a temperature of 60° C. within the glove box.

After injecting 40 ml of anhydrous methanol into thus-obtained ZnSe first solution, ultrasonic vibration was applied to the resulting mixture of anhydrous methanol and ZnSe first solution for one hour. After allowing the mixture to stand for about 24 hours, a mixture of the ZnSe first solution and anhydrous methanol was centrifuged to obtain a ZnSe precipitate. The obtained ZnSe precipitate was cleaned with methanol three times to obtain a cleaned ZnSe precipitate.

2 mg of the cleaned ZnSe precipitate was remelted in 10 g of hydrazine monohydrate to obtain a ZnSe second solution.

The ZnSe second solution was spin-coated on an ITO glass substrate to form a ZnSe solution layer on the substrate.

The ZnSe solution layer was heated at 70° C. in a nitrogen atmosphere for 30 minutes, and hydrazine monohydrate was removed to form a ZnSe precursor film layer.

The ZnSe precursor film layer on the substrate was heated and annealed at 180° C. in a nitrogen atmosphere for 60 minutes to complete a ZnSe film.

Comparative Example 3—Manufacturing of ZnS Film without Using Sodium

After injecting 30 mg of S into 10 g of hydrazine monohydrate, a solvent system was prepared by dissolving S while stirring S and hydrazine monohydrate at a temperature of 60° C. within a glove box.

After injecting 100 mg of ZnS powder into thus-obtained solvent system, a ZnS first solution was prepared by dissolving the ZnS powder while stirring the ZnS powder at a temperature of 60° C. within the glove box.

After injecting 40 ml of anhydrous methanol into thus-obtained ZnS first solution, ultrasonic vibration was applied to the resulting mixture of anhydrous methanol and ZnS first solution for one hour. After allowing the mixture to stand for about 24 hours, a mixture of the ZnS first solution and anhydrous methanol was centrifuged to obtain a ZnS precipitate. The obtained ZnS precipitate was cleaned with methanol three times to obtain a cleaned ZnS precipitate.

3 mg of the cleaned ZnS precipitate was remelted in 10 g of hydrazine monohydrate to obtain a ZnS second solution.

The ZnS second solution was spin-coated on an Si-wafer substrate to form a ZnS solution layer on the substrate.

The ZnS solution layer was heated at 80° C. in a nitrogen atmosphere for 10 minutes, and hydrazine monohydrate was removed to form a ZnS precursor film layer.

The ZnS precursor film layer on the substrate was heated and annealed at 200° C. in a nitrogen atmosphere for 30 minutes to complete a ZnS film.

<Tests and Results>

Figure 2:
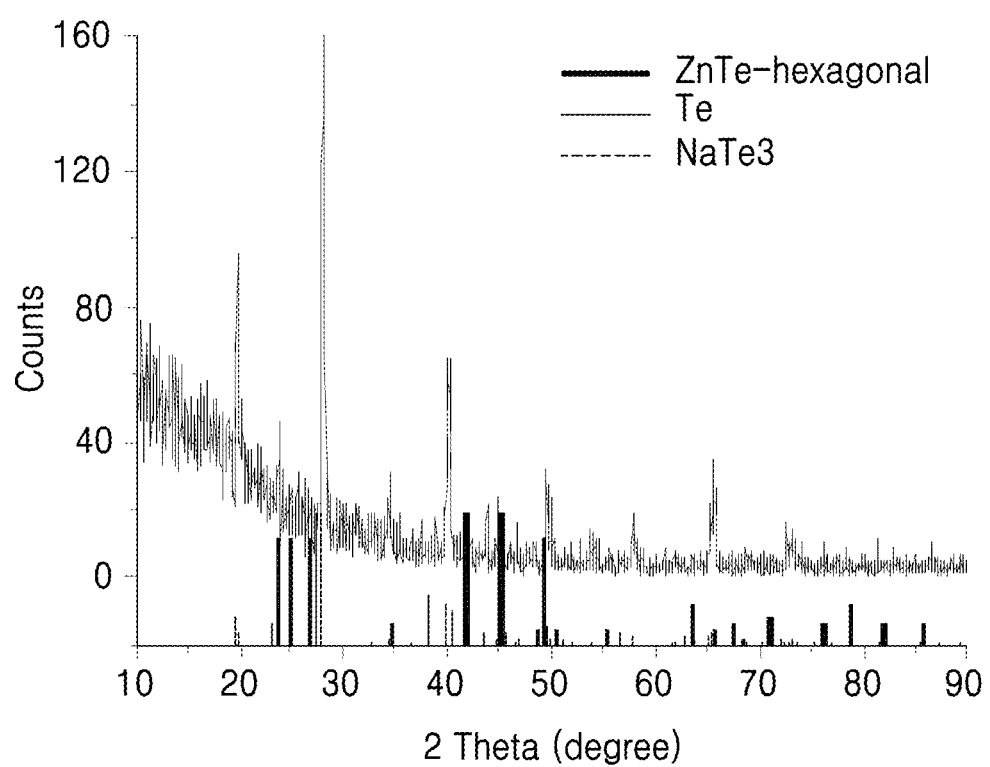
FIG. 2 is an XRD analysis result of a ZnTe precipitate centrifuged from a mixture of a ZnTe first solution and anhydrous methanol in Example 1.
Figure 3:
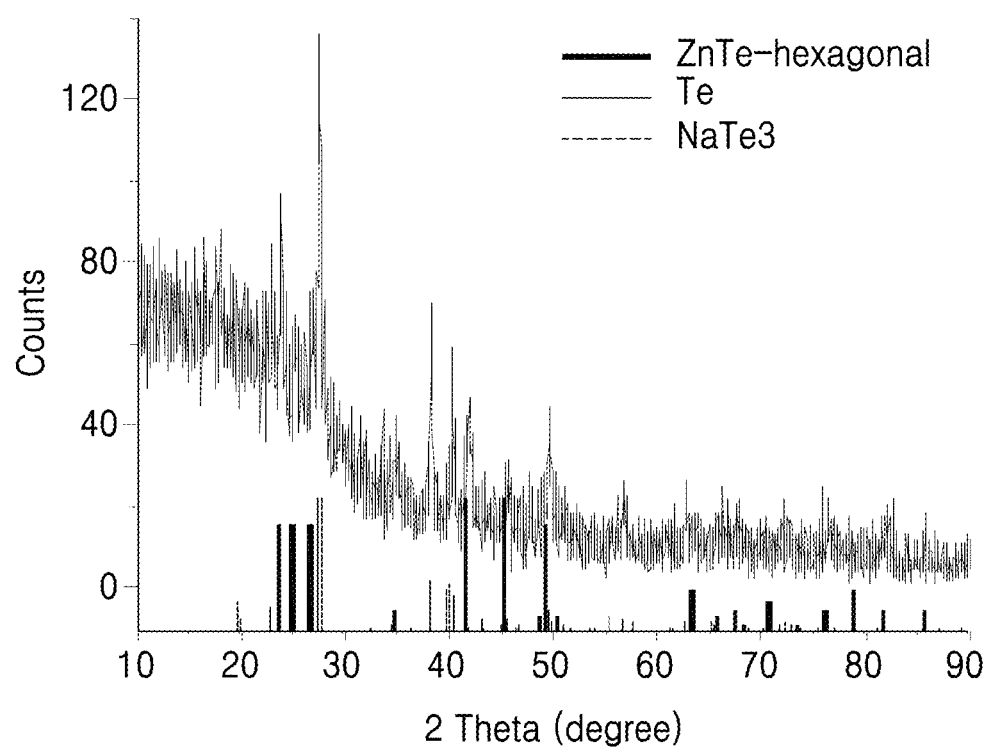
FIG. 3 is an XRD analysis result of a ZnTe precipitate cleaned once with methanol in Example 1.
Figure 4:
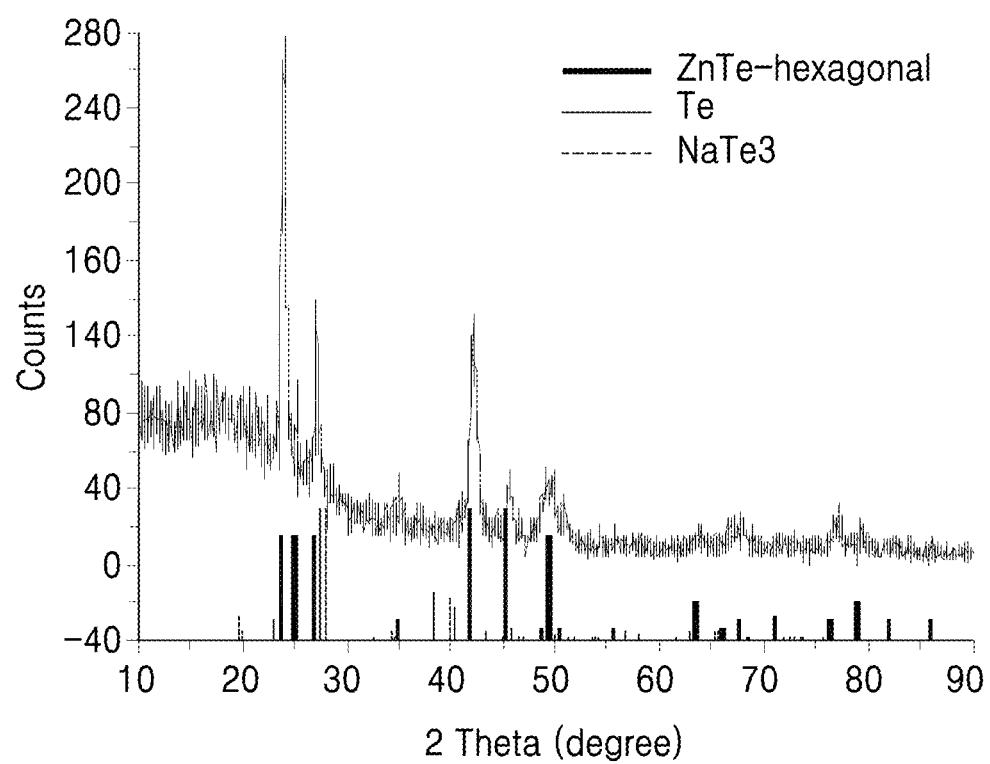
FIG. 4 is an XRD analysis result of a ZnTe precipitate cleaned three times with methanol in Example 1.

FIG. 2 is an XRD analysis result of a ZnTe precipitate centrifuged from a mixture of a ZnTe first solution and anhydrous methanol in Example 1. FIG. 3 is an XRD analysis result of a ZnTe precipitate cleaned once with methanol in Example 1. FIG. 4 is an XRD analysis result of a ZnTe precipitate cleaned three times with methanol in Example 1. In FIG. 2, Na and impurity peaks are shown. In FIG. 3, Na peaks and an excessive Te peak are shown although a lot of the Na peaks had been reduced. In FIG. 4, all impurity peaks associated with Na and Te are not shown, and only ZnTe peaks are shown.

Inductively Coupled Plasma (ICP) analysis results for the ZnTe first solution and the ZnTe second solution obtained from Example 1 are summed up in the following Table 1:

TABLE 1

| | Samples | | |
|---|---|---|---|
| | Na | Zn | Te |
| ZnTe first solution | 45.4 | 2.3 | 52.3 |
| ZnTe second solution | 2.9 | 53.3 | 43.8 |

As shown in Table 1, it can be confirmed that Na and excessive Te were effectively removed by the cleaning process.

Amounts of the precipitates obtained by the first solutions of Examples 1 to 3 and Comparative Examples 1 to 3.

TABLE 2

| Sample No. | Types of precipitates | Amounts of precipitates (mg) |
|---|---|---|
| Example 1 | ZnTe | 100 |
| Comparative Example 1 | ZnTe | 0.2 |
| Example 2 | ZnSe | 100 |
| Comparative Example 2 | ZnSe | 2 |
| Example 3 | ZnS | 100 |
| Comparative Example 3 | ZnS | 3 |

The amounts of the precipitates obtained by washing the first solutions represent solubility of the chalcogenide compounds with respect to hydrazine monohydrates. Therefore, as it can be seen from Table 2, a solubility of ZnTe in Example 1 in which sodium was used increased about 500 times compared to that of ZnTe in Comparative Example 1 in which sodium was not used; a solubility of ZnSe in Example 2 in which sodium was used increased about 50 times compared to that of ZnSe in Comparative Example 2 in which sodium was not used; and a solubility of ZnS in Example 3 in which sodium was used increased about 33 times compared to that of ZnS in Comparative Example 3 in which sodium was not used.

Figure 5:
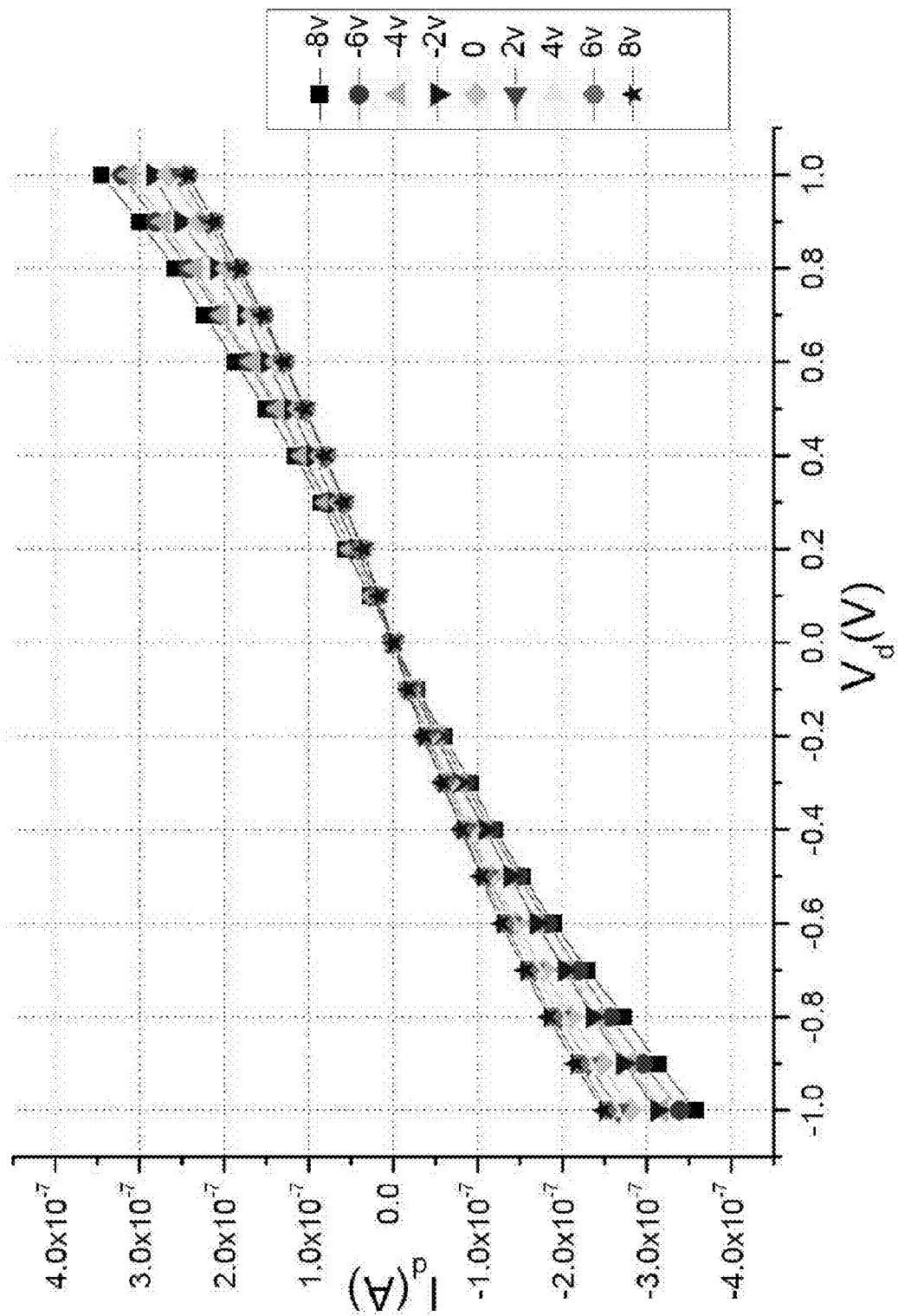
FIG. 5 is an analysis result of TFT (field effect transistor) characteristics of a ZnTe film formed by a process of Example 1.

FIG. 5 is an analysis result of TFT (field effect transistor) characteristics of a ZnTe film formed by the process of Example 1. As shown in FIG. 5, the ZnTe film formed by the process of Example 1 displayed characteristics of a p-type semiconductor, which confirms that a metal chalcogenide film may be effectively formed by using a precursor solution for forming a metal chalcogenide film containing as a solvent a hydrazine hydrate according to the present disclosure.

Figure 6:
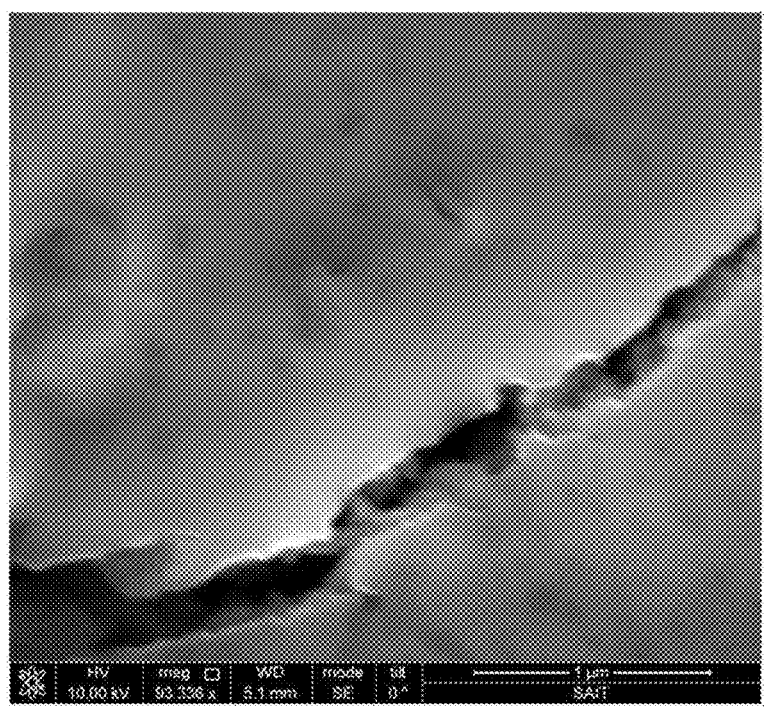
FIG. 6 is an SEM (Scanning electron microscope) photograph of a ZnTe film formed by a process of Example 1.

FIG. 6 is an SEM photograph of a ZnTe film formed by processes of Example 1. It can be seen more certainly that the ZnTe film was formed through a crack produced in the drying process.

As described above, according to the one or more of the above embodiments, the non-explosive hydrazine-based solvent has substantially low toxicities compared to hydrazine. Further, the non-explosive hydrazine-based solvent is free of explosiveness in the air. Accordingly, the precursor solution for forming a metal chalcogenide film of the present disclosure based on hydrazine hydrates, hydrazine derivatives, or hydrazine derivative hydrates may be applied to a metal chalcogenide film-forming process very safely and inexpensively. Further, since the precursor solution for forming a metal chalcogenide film of the present disclosure is free of explosiveness, it is possible to anneal a precursor film in the air, which is formed from the precursor solution for forming a metal chalcogenide film of the present disclosure. Therefore, the precursor solution for forming a metal chalcogenide film of the present disclosure may also be applied to manufacturing inorganic oxide films. Sodium ions existing in the non-explosive hydrazine-based solvent may accelerate the ionization of a chalcogen element to generate chalcogen ions in the non-explosive hydrazine-based solvent. Further, the chalcogen element or ions may be coupled to sodium ions in the non-explosive hydrazine-based solvent to form an ion complex. Further, sodium ions and chalcogen ions, or the ion complex that is formed by coupling a chalcogen element or ions to sodium ions may accelerate the dissolution of metal chalcogenide compounds through dimension reduction mechanisms.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A precursor solution for forming a metal chalcogenide film, the precursor solution comprising:
    a solvent system comprising a hydrazine-based solvent, a chalcogen ion and a sodium ion; and
    a metal chalcogenide compound dissolved in the solvent system,
    wherein the metal chalcogenide compound exists in the form of a monomer or cluster in the solvent system.

2. The precursor solution of claim 1, wherein the hydrazine-based solvent is selected from the group consisting of a hydrazine hydrate, hydrazine derivative, a hydrazine derivative hydrate, and a combination thereof.

3. The precursor solution of claim 2, wherein the hydrazine derivative is selected from the group consisting of methyl hydrazine, dimethyl hydrazine, ethylenediamine, 1,3-diaminopropane, phenylenediamine, ethylamine, propylamine, diethylamine, and a combination thereof.

4. The precursor solution of claim 2, wherein the hydrazine derivative hydrate is selected from the group consisting of: a hydrate of methyl hydrazine, dimethyl hydrazine, ethylenediamine, 1,3-diaminopropane, phenylenediamine, ethylamine, propylamine and diethylamine; and a combination thereof.

5. The precursor solution of claim 1, comprising the hydrazine-based solvent in an amount of about 500 parts by weight to about $1 \times 10^8$ parts by weight based on 100 parts by weight of the metal chalcogenide compound.

6. The precursor solution of claim 1, wherein the chalcogen element contained in the metal chalcogenide compound is the same as the chalcogen element of the chalcogen ion.

7. The precursor solution of claim 1, comprising the chalcogen ion in an amount of about 1 part by weight to about 10,000 parts by weight based on 100 parts by weight of the metal chalcogenide compound.

8. The precursor solution of claim 1, comprising the sodium ion in an amount of about 1 part by weight to about 10,000 parts by weight based on 100 parts by weight of the metal chalcogenide compound.

9. The precursor solution of claim 1, wherein the hydrazine-based solvent is selected from the group consisting of a hydrazine derivative, a hydrazine derivative hydrate, and a combination thereof.

10. The precursor solution of claim 9, wherein the hydrazine derivative is selected from the group consisting of ethylenediamine, 1,3-diaminopropane, phenylenediamine, ethylamine, propylamine, diethylamine, and a combination thereof.

11. A method of preparing a precursor solution for forming a metal chalcogenide film, the method comprising dissolving a metal chalcogenide compound in a solvent system containing a chalcogen element cation, a sodium cation, and a hydrazine-based solvent to form a first solution containing the metal chalcogenide compound,
    wherein the metal chalcogenide compound exists in the form of a monomer or cluster in the solvent system.

12. The method of claim 11, further comprising:
    adding a first cleaning solvent to the first solution to obtain a metal chalcogenide compound precipitate (precipitation step);
    optionally subjecting the metal chalcogenide compound precipitate to washing using a second cleaning solvent (washing step); and
    dissolving the metal chalcogenide compound precipitate obtained in the precipitation step or the washing step in the hydrazine-based solvent to obtain a second solution containing the metal chalcogenide compound.

13. The method of claim 12, wherein the first cleaning solvent and the second solvent, same or different, each are selected from the group consisting of methanol, ethanol, propanol, butanol, and a combination thereof.

14. A method of manufacturing a metal chalcogenide film, the method comprising:
    coating a substrate with a precursor solution, said precursor solution comprising a solvent system comprising a hydrazine-based solvent, a chalcogen ion and a sodium ion and a metal chalcogenide compound dissolved in the solvent system, so as to form a metal chalcogenide precursor solution layer on the substrate;
    removing the solvent system from the metal chalcogenide precursor solution layer to form a precursor film layer; and
    annealing the metal chacogenide precursor film layer to form the metal chalcogenide film,
    wherein the metal chalcogenide compound exists in the form of a monomer or cluster in the solvent system.

15. The method of claim 14, wherein the removing of the solvent system is carried out by heating the metal chalcogenide precursor solution layer to a temperature of about 70° C. to about 200° C.

16. The method of claim 14, wherein the annealing of the precursor film layer is conducted by heating the metal chalcogenide precursor film layer to a temperature of about 70° C. or higher.

* * * * *